(12) United States Patent
Koning

(10) Patent No.: US 6,365,973 B1
(45) Date of Patent: Apr. 2, 2002

(54) FILLED SOLDER

(75) Inventor: Paul A. Koning, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/457,057

(22) Filed: Dec. 7, 1999

(51) Int. Cl.$^7$ .............................................. H01L 23/48
(52) U.S. Cl. ...................................... 257/772; 257/779
(58) Field of Search ............................... 257/779, 778, 257/738, 737, 772

(56) References Cited

U.S. PATENT DOCUMENTS 5,520,752 A * 5/1996 Lucey, Jr. et al. .......... 148/400
5,721,455 A * 2/1998 Takashita ..................... 257/713
6,008,543 A * 12/1999 Iwabuchi ..................... 257/778

OTHER PUBLICATIONS

Smay, Gary L., "Surface–Energy Determinations of Tin Oxide–Coated Soda–Lime–Silica Glass," J. Am. Ceram. Soc., 71[4], Apr. 1988, C–217–C–219.

The micrograph set entitled "K7 Package—Solder Column" illustrates an analysis of a commercially available K7 chip assembly produced by Advanced Micro Devices, Inc. the analysis appears to illustrate carbon–containing particulates within a solder joint proximate the "cermic package side" of the assembly, and silicon–containing particulates within a solder joint proximate the "PCB (printed circuit board) side" of the assembly.

* cited by examiner

*Primary Examiner*—Roy Potter
(74) *Attorney, Agent, or Firm*—Robert G. Winkle

(57) ABSTRACT

A filled solder material comprising a solder material having a plurality of coated filler particles disposed therein, wherein said coated filler particles alter the coefficient of thermal expansion of the filled solder material. The coated filler particles are preferably made of a low CTE material, such as graphite, carbon fiber, diamond, boron nitride, aluminum nitride, silicon carbide, silicon nitride, zinc oxide, alumina, titanium diboride, and silica, with a coating which is wettable with the solder material, such as cobalt, copper, copper oxide, nickel, iron, tin, tin oxide, zinc, and alloys thereof. In application, the filler solder material may be used as an electrical contact, such as solder balls on a flip-chip package, as a thermal contact, such as an attachment material between a microelectronic chip and a heat dissipation device, and/or as a mechanical attachment mechanism.

19 Claims, 4 Drawing Sheets

FILLED SOLDER

BACKGROUND OF THE INVENTION

1. Field of the Invention

The present invention relates to solder materials used in microelectronic device packaging. In particular, the present invention relates to altering the coefficient of thermal expansion of solder used in mechanical, thermal, and/or electrical contacts in microelectronic device packages.

2. State of the Art

A variety of materials are used in the microelectronics industry for a forming components and attaching components together. One highly versatile material is solder, primarily alloys of lead and tin. Solder may be used for mechanical, electrical, and/or thermal attachment of components.

FIG. 4 illustrates an exemplary flip-chip attachment of a microelectronic device 202 to a substrate 204, such as an FR-4 substrate. The microelectronic device 202 is mechanically and electrically attached to the substrate 204 through a plurality of solder balls 206 which extend between discrete contact pads 208 on an active surface 212 of the microelectronic device 202 and contact pads 214 on the substrate 204. A heat dissipation device (shown as a heat slug 216 is mechanically attached to a back surface 218 of the microelectronic device 202 with a layer of solder 222. The solder layer 222 allows thermal conduction of heat from the microelectronic device 202 to the heat slug 216. The heat from the microelectronic device 202 is dissipated from the heat slug 216 to the ambient environment. Thus, solder is used for both the mechanical and electrical attachment of the microelectronic device 202 to the substrate 204 and the mechanical and thermal attachment of the heat slug 216 to the microelectronic device 202.

One problem which must be addressed in the connection of various different types of materials (i.e., microelectronic devices, substrates, heat slugs, etc.) is the coefficient of thermal expansion (CTE) for each material. The CTE is a measurement of the expansion and contraction of each material during heating and cooling cycles, respectively. These heating and cooling cycles occur during the operation of the microelectronic device 202 and during power up and power down of the microelectronic device 202.

The attachment of a heat dissipation device to a microelectronic device is particularly problematical. The material of the heat dissipation device (e.g., heat slug 216) generally comprises a metal, while the material of the microelectric device 202 generally comprises a silicon material. The CTE difference between a metal and a silicon material is considerable. The CTE difference between the heat slug 216 and the microelectronic device 202 results in stresses that may degrade the performance of the microelectronic device 202 through warpage and may result in premature device failure, such as by the cracking of the microelectronic device 202.

The microelectronics industry has addressed the CTE mismatch problem with a variety of solutions, such as altering the CTE of the materials used. For example, in heat dissipation devices may be made from aluminum filled with silicon carbide ceramic particles. The silicon carbide ceramic filled aluminum has high heat transfer and has a lessened CTE compared to pure aluminum. Such silicon carbide carbide ceramic filled aluminum products are available from Lanxide Electronic Components, Inc., Newark, Del., USA.

Although the CTE mismatch problem has been or is being continuously addressed, another CTE problem has arisen as a result of industry's continuous generation of smaller and smaller microelectronic devices. The smaller microelectronic devices result in the CTE of the attachment materials, such as solder, having an effect on the microelectronic package.

Unfortunately, the solders presently used generally have a higher CTE than the materials they join (i.e., they expand and contract at a faster rate than the surrounding material when heated and cooled, respectively). For example, in the attachment of the heat slug 216 to the microelectronic device 202, the CTE mismatch of solder may result in the solder layer 222 becoming detached from the either the heat slug 216 or the microelectronic device 202. This detachment may reduce the efficiency of the thermal contact between the heat slug 216 and the microelectronic device 202, which can result in the premature failing of the microelectronic device 202 due to thermal degradation. With regard to the solder balls 206, the CTE mismatch of the solder in the solder balls 206 may result in one or more of the solder balls 206 becoming detached from the substrate contact pad 214 or the microelectronic device contact pad 208, either of which may result in a failure of the microelectronic device 202.

Therefore, it would be advantageous to develop a solder which has a CTE comparable to the components to which the solder is in electrical, mechanical, and/or thermal contact.

SUMMARY OF THE INVENTION

The present invention relates to altering the coefficient of thermal expansion of solder used in thermal and/or electrical contacts in microelectronic packages. Specifically, the present invention relates to a filled solder material comprising a solder material having a plurality of coated filler particles disposed therein.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
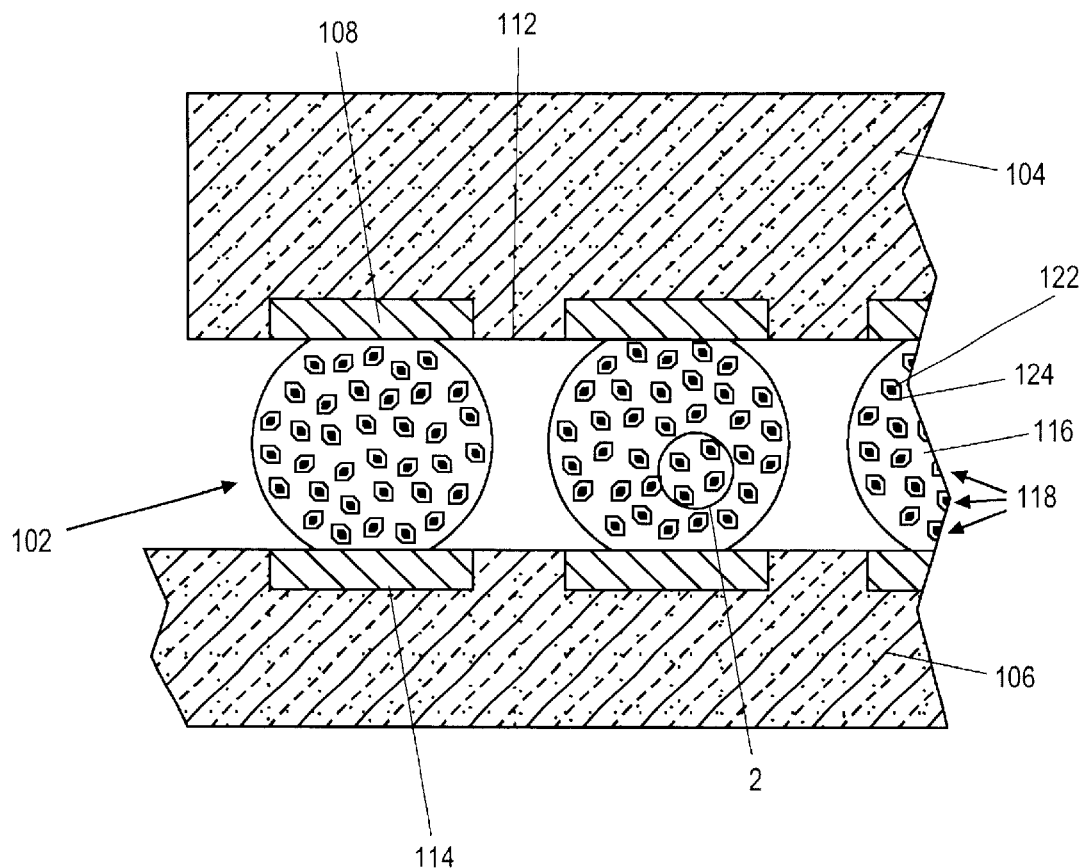
FIG. 1 is a side cross-sectional view of a microelectronic device attached to a substrate with a plurality of filled solder balls, according to the present invention.
Figure 2:
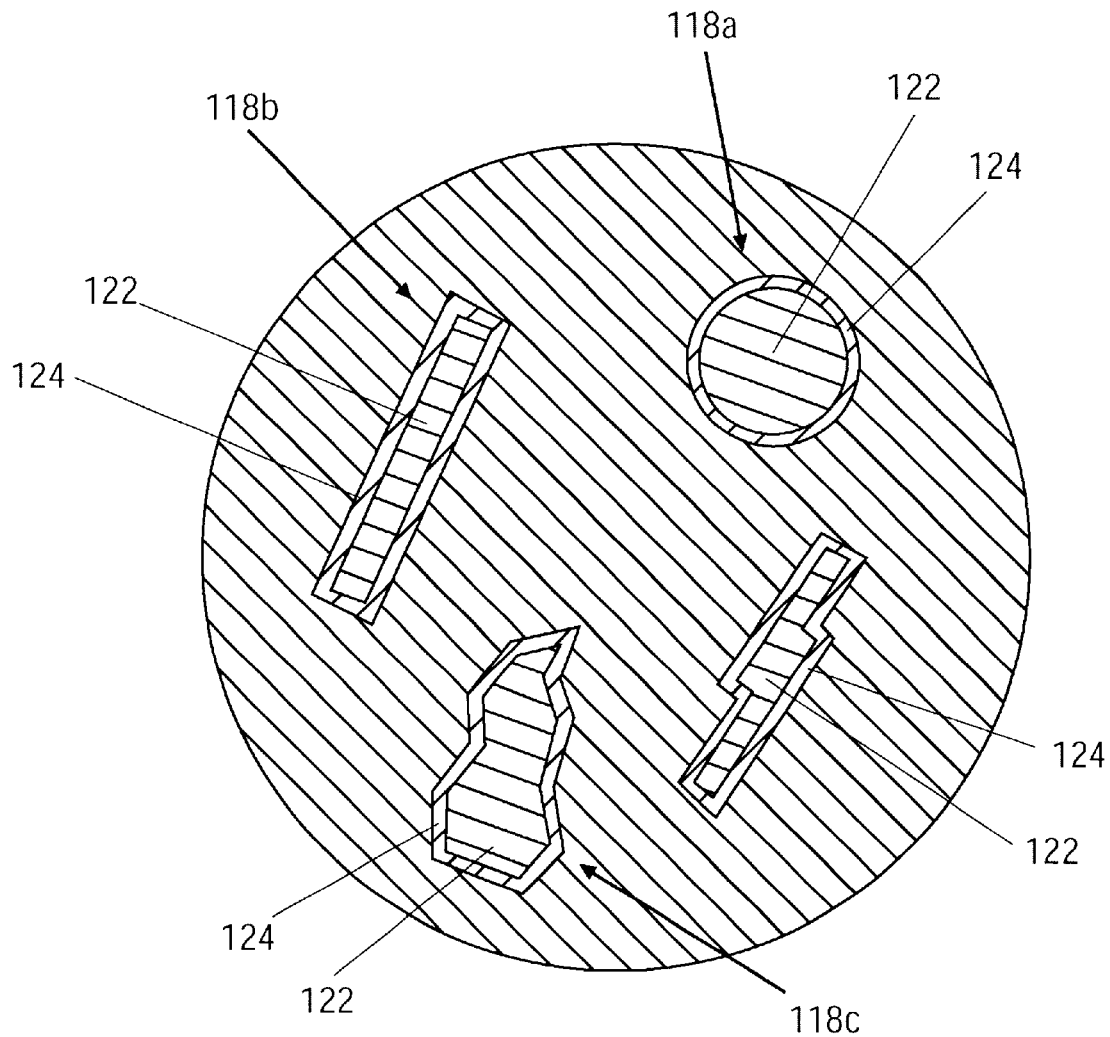
FIG. 2 is a side cross-sectional view of an enlargement of inset 2 in a filled solder ball of FIG. 1, according to the present invention.
Figure 3:
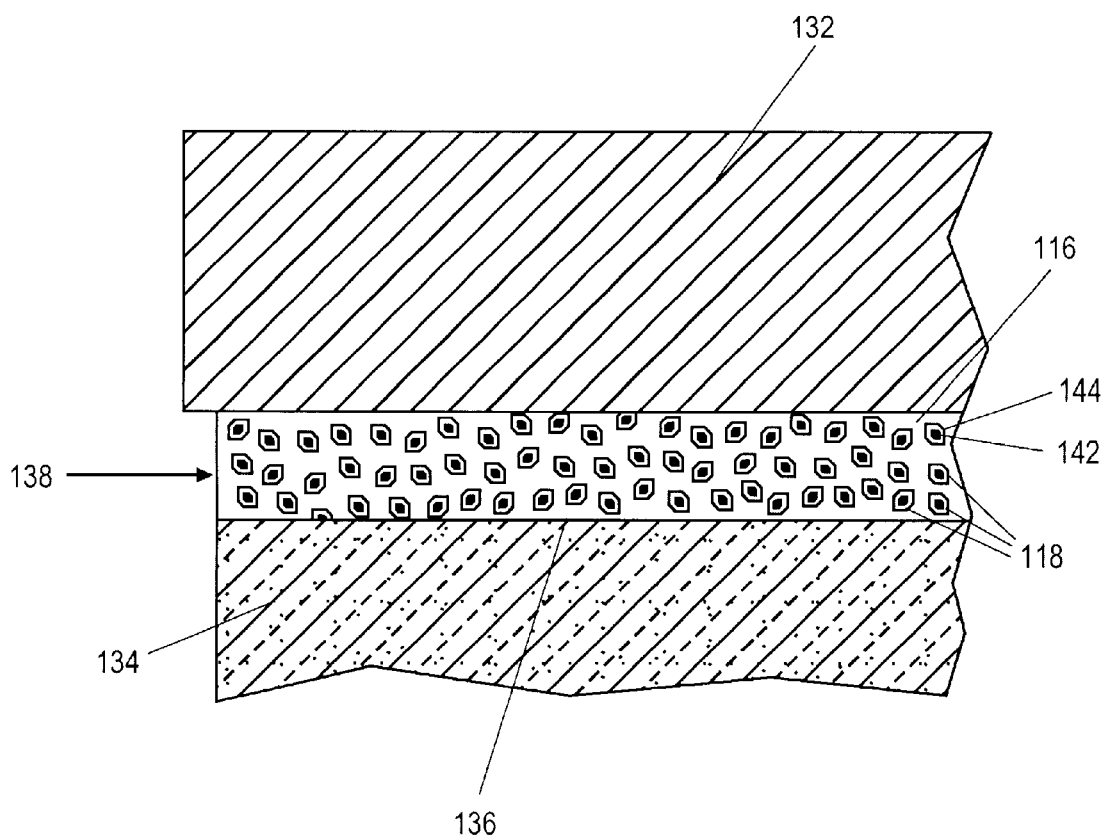
FIG. 3 is a side cross-sectional view of a heat dissipation device attached to a microelectronic device with a layer of filled solder, according to the present invention.
Figure 4:
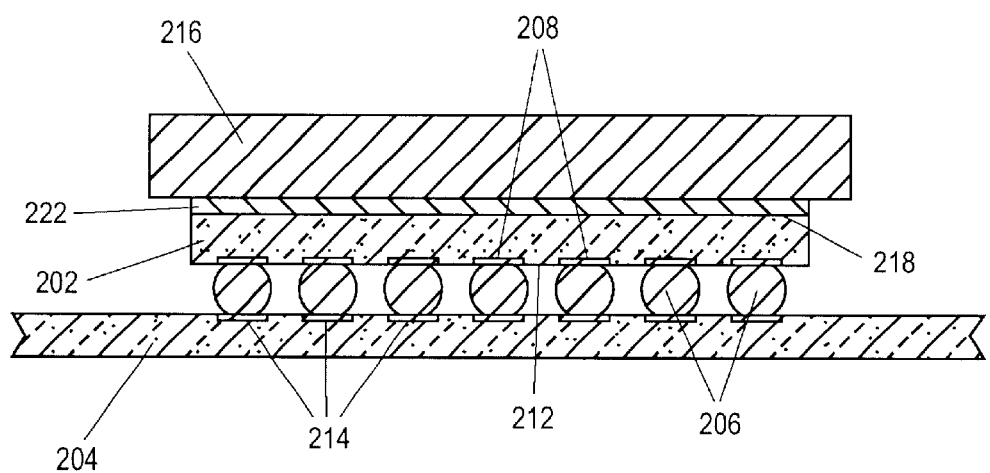
FIG. 4 is a cross-sectional view of a flip chip attachment of a microelectronic device to a substrate, wherein the microelectronic device has a heat dissipation device attached thereto, as known in the art.

Although FIGS. 1, 2, and 3 illustrate views of the present invention, these figures are not meant to portray microelectronic components in precise detail. Rather, these figures illustrate microelectronic components in a manner to more clearly convey the concepts of the present invention. Additionally, elements common between the figures retain the same numeric designation.

The present invention includes the modification of the coefficient of thermal expansion ("CTE") of solder through the use of filler material. A problem which arises with the use of filler material is that the most solder materials are non-wetting with most fillers, particularly ceramic fillers, which are advantageous in lowering CTE of the solder material. Thus, blends of solder material and filler material are not stable, as they either cannot be successfully mixed, the mix separates after agitation is discontinued, or the mix separates after only a short time in the liquid state.

However, it has been found that a filler material with a low CTE may be coated or "surface treated" with materials that are capable of adhering to the filler material, yet are wettable in solder material. Ideally, the filler material would have a low (CTE) and be incorporated at a sufficiently high level to significantly reduce the CTE of the solder/filler blend. The lower CTE results in lower thermal mismatch, less internal stress during thermal cycling, and, therefore, a more reliable attachment.

A first exemplary application of the present invention relates to situations where high electrical conductivity of the filled solder is as important as a low CTE. FIG. 1 illustrates such an application, wherein a filled solder ball 102 mechanically and electrically attaches a microelectronic device 104 to a substrate 106. The filled solder ball 102 extends between discrete contact pads 108 on an active surface 112 of the microelectronic device 104 and contact pads 114 on the substrate 106. The filled solder ball 102 comprises a solder material 116 having coated filler material 1 18 dispersed therein. The solder material 116 may include, but is not limited to lead, tin, indium, gallium, bismuth, cadmium, zinc, copper, gold, silver, antimony, germanium, and alloys thereof.

For achieving high electrical conductivity, the coated filler material 118 may comprise an electrically conductive filler 122 having a low CTE, including graphite, carbon fiber, diamond, titanium diboride, and the like. The electrically conductive filler 122 has a coating 124 thereover, including but not limited to cobalt, copper, nickel, iron, tin, zinc, gold, silver, or alloys thereof. Some of such coated filler materials in various combinations may be obtained from Advanced Ceramics Corporation, Cleveland, Ohio, USA. The coating 124 may also be metal oxides and organometallic materials that are compatible with the solder material 116. The metal oxides may include, but are not limited to tin oxide, copper oxide, and the like.

FIG. 2 illustrates an enlargement of inset 2 of FIG. 1. FIG. 2 shows cross sections of several particles of the coated filler material 118 (FIG. 1). The particles of the coated filler material 118 (FIG. 1) may be substantially spherical (shown in FIG. 2 as element 118a), elongated (shown in FIG. 2 as element 118b), random shaped (shown in FIG. 2 as element 118c), or any such geometric configuration and combinations thereof.

A second exemplary application of the present invention relates to situations where high thermal conductivity of the filled solder is as important as low CTE. FIG. 3 illustrates such an application, wherein a heat dissipation device 132 is attached to a back surface 136 of a microelectronic device 134 by a layer of filled solder 138. The filled solder 138 comprises solder material 116 having coated filler material 118 dispersed therein. For achieving high thermal conductivity, the coated filler material 118 may comprise a thermally conductive filler 142 having a low CTE, including boron nitride, aluminum nitride, silicon carbide, silicon nitride, zinc oxide, alumina, titanium diboride, and the like.

The thermally conductive filler 142 has a coating 144 thereover, including but not limited to cobalt, copper, nickel, iron, tin, zinc, or alloys thereof. It is, of course, understood that the materials comprising the electrically conductive filler material 112 and the materials comprising the thermally conductive filler 142 may overlap, as electrically conductive materials are also generally thermally conductive, as for example graphite or carbon fiber.

A third exemplary application of the present invention relates to situations where low CTE of the filled solder is of highest importance. In such an application, low CTE materials, such a silica (e.g., amorphous silica, silicon dioxide, and the like), may be used a filler material. Silica materials are not particularly thermally or electrically conductive, but as silica materials have a low CTE they will act to significantly lower the overall CTE of the filled solder.

For example, a filled solder comprising a solder material of a lead/tin alloy having a filler material of nickel-coated, spherical silica in a volume ration of between about 30% solder/70% silica and 70% solder/30% silica should yield a low CTE filled solder. Furthermore, in such volume ratios, the low CTE filled solder should still retain good electrical and heat transfer properties, because the solder material will be the continuous phase.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A filled solder material, comprising:
   a solder material; and
   a plurality of coated filler particles disposed within said solder material, wherein said plurality of coated filler particles comprise a first material substantially coated with a coating material and wherein said first material comprises a material different from said coating material.

2. The filled solder material of claim 1, wherein said first material comprises a low CTE material and wherein said coating material is wettable with said solder material.

3. The filled solder material of claim 2, wherein said low CTE material comprises a thermally conductive material.

4. The filled solder material of claim 2, wherein said low CTE material comprises an electrically conductive material.

5. The filled solder material of claim 2, wherein said low CTE material is selected from the group consisting of graphite, carbon fiber, diamond, boron nitride, aluminum nitride, silicon carbide, silicon nitride, zinc oxide, alumina, titanium diboride, and silica.

6. The filled solder material of claim 2, wherein said coating material is selected from the group consisting of cobalt, copper, nickel, iron, tin, zinc, and alloys thereof.

7. The filled solder material of claim 2, wherein said coating material is selected from the group consisting of copper oxide and tin oxide.

8. A microelectronic package, comprising:
   a microelectronic device having an active surface;
   a plurality of solder balls discretely disposed on a plurality of contact pads on said microelectronic device active surface; and
   said plurality of solder balls comprising a solder material having a plurality of coated filler particles disposed therein, wherein said plurality of coated filler particles comprise a first material substantially coated with a coating material and wherein said first material comprises a material different from said coating material.

9. The filled solder material of claim 8, wherein said first material comprises a low CTE material and wherein said coating material is wettable with said solder material.

10. The filled solder material of claim 9, wherein said low CTE material comprises an electrically conductive material.

11. The filled solder material of claim 10, wherein said electrically conductive low CTE material is selected from the group consisting of graphite, carbon fiber, diamond, and titanium diboride.

12. The filled solder material of claim 9, wherein said coating material is selected from the group consisting of cobalt, copper, nickel, iron, tin, zinc, and alloys thereof.

13. The filled solder material of claim 9, wherein said coating material is selected from the group consisting of copper oxide and tin oxide.

14. A microelectronic package, comprising:
a microelectronic device having a back surface;
a heat dissipation device attached by a layer of filled solder to said microelectronic device back surface; and
said filled solder layer comprising a solder material having a plurality of coated filler particles disposed therein, wherein said plurality of coated filler particles comprise a first material substantially coated with a coating material and wherein said first material comprises a material different from said coating material.

15. The filled solder material of claim 14, wherein said first material comprises a low CTE material and wherein said coating material is wettable with said solder material.

16. The filled solder material of claim 15, wherein said low CTE material comprises a thermally conductive material.

17. The filled solder material of claim 16, wherein said thermally conductive low CTE material is selected from the group consisting of boron nitride, aluminum nitride, silicon carbide, silicon nitride, zinc oxide, alumina, and titanium diboride.

18. The filled solder material of claim 15, wherein said coating material is selected from the group consisting of cobalt, copper, nickel, iron, tin, zinc, and alloys thereof.

19. The filled solder material of claim 15, wherein said coating material is selected from the group consisting of copper oxide and tin oxide.

* * * * *